United States Patent [19]

Igel

[11] 4,257,108
[45] Mar. 17, 1981

[54] PULSE GENERATOR

[75] Inventor: Anders N. E. Igel, Järfälla, Sweden

[73] Assignee: U.S. Philips Corporation, New York, N.Y.

[21] Appl. No.: 971,765

[22] Filed: Dec. 21, 1978

[30] Foreign Application Priority Data

Dec. 27, 1977 [SE] Sweden .............................. 7714753

[51] Int. Cl.$^3$ ........................ H03K 5/04; H03K 5/156
[52] U.S. Cl. ............................... 364/900; 235/92 CC; 307/265; 307/269; 328/59
[58] Field of Search ............... 307/260, 265, 269, 293; 328/59, 60, 62, 29, 63; 364/200 MS File, 900 MS File; 295/92 CC

[56] References Cited

U.S. PATENT DOCUMENTS

| | | | |
|---|---|---|---|
| 3,564,429 | 2/1971 | Miller et al. | 328/63 |
| 3,633,113 | 1/1972 | Grubel | 328/62 |
| 3,739,199 | 6/1973 | Negrou | 328/59 |
| 3,743,754 | 7/1973 | Eisenberg | 328/59 |
| 3,913,021 | 10/1975 | McCarthy et al. | 307/260 |
| 4,109,209 | 8/1978 | Bismarck | 328/60 |
| 4,122,309 | 10/1978 | Jacobsen | 328/60 |
| 4,165,490 | 8/1979 | Howe, Jr. et al. | 328/60 |

*Primary Examiner*—Joseph M. Thesz
*Assistant Examiner*—E. Chan

[57] ABSTRACT

A pulse generator for generating pulse groups with desired widths and relations (spacings) within and between the groups up to extremely high speeds and with a time accuracy of the order of nanoseconds e.g. in radar applications. It is purely digital and operates on a control frequency which may be derived from an internal crystal oscillator or may be externally supplied. The generator is divided into two main units, a first unit for determining the spacing of the pulse groups, and a second unit controlled by the first unit for determining the pulse widths and controlling pulse generator means. Different time space numbers and pulse widths numbers may be programmed into PROM memories of said units and may be selected by the same set of operating mode signals. The time spacing may also be optimized by means of an external computer controlling a further PROM holding information which may be combined with the time distance PROM information. Staggering and jittering radar modes may be obtained by supplying relevant mode signals. The pulse groups may comprise a ("listening interval") control pulse having a time position which falls within the next following pulse group but is generated with a fixed relation to the pulses of its own group. Further trimming possibilities with respect to the internal pulse relations of a group are available. All mode signals required are of the two-level type.

8 Claims, 13 Drawing Figures

PULSE GENERATOR

BACKGROUND OF THE INVENTION

This invention relates to a pulse generator for generating pulse groups each comprising a predetermined number of pulses of given pulse widths and given relations within the group, said pulses being used for example as synchronization and triggering pulses in a radar system, and in which the pulse generation is carried out purely digtally using digital circuit elements and depending on a control frequency, which is generated by a crystal oscillator provided therein or, alternatively, which is supplied externally.

A pulse generator embodying the invention is useful in different applications in which trigger and synchronization pulses generated with a high level of frequency stability are required. One specific application for such a pulse generator is as a synchronization generator in a MTI radar system of the pulse Doppler type, that is a radar system using the Doppler effect for obtaining velocity information with respect to targets.

The echo signals of a moving target as well as the received clutter vary in phase and amplitude. A pulse Doppler radar utilizes the phase variation of the echo signal to recognize the Doppler component produced by a moving target. A pulse Doppler radar, therefore, must be either transmitter coherent or receiver coherent. This makes it necessary to use a frequency stable synchronization generator which directly or indirectly will take care of the time control of the transmitter and receiver elements.

Dependent on the area of application of the pulse doppler radar system different radar pulse repetition frequencies (PRF's) are desirable, which in turn demands that the pulse groups required for the function of the radar and supplied by the synchronizing generator are repeated at a selected PRF, which may bring with it changed pulse widths and pulse distances within the group.

One problem with pulse doppler radars is that the of so-called blind velocities are directly proportional to the PRF. Varying the PRF may enable a specific targer to be visible at at least one frequency. The variation may be obtained by so-called staggering, that is alternatively short and long radar pulse intervals.

In order to prevent the radar system from being jammed by interference so called jittering of the PRF may be used, that is varying the frequency randomly within a frequency interval around a selected PRF.

An object of the invention is to provide a digital pulse generator which is suitable for use as a synchronizing pulse generator in a radar system and which makes possible a selection of PRF and a desired mode of operation, for example staggering or jittering, only by the supply of fixed PRF selection codes and mode selection codes, and in which a very high frequency stability is maintained independent of the functional mode and thereby making possible a good measurement accuracy and clutter suppression.

SUMMARY OF THE INVENTION

According to the invention a pulse generator of the type mentioned in the introductory part of the description is characterized in that it comprises controllable pulse generator means for generating the pulses of each pulse group; a first unit for determining the time space between pulse groups and comprising first storage means in which selectable time space numbers are programmed, and a first sequential counting circuit which is arranged so as to supply a time space pulse during each cycle of operation, said sequential counting circuit being clocked by a clock signal derived from the control frequency, and the operating cycle of the sequential circuit being determined by an original or modified time space number; and a second unit for controlling the pulse generator means and comprising second storage means in which pulse edge position numbers for determining said pulse widths and time positions are programmed in storage areas being also selectable, a second sequential counting circuit which is clocked by said clock signal and the operating cycle of which is determined by said time space pulse supplied by said first sequential counting circuit, and comparing and addressing means for comparing continuously the output signal of the second sequential circuit and the actual pulse edge position number and for generating at a detected correspondance a control signal for that one of said pulse generator means for which the said pulse edge position number is intended.

Said storage means enable a simplified construction for the pulse generator which may easily be adapted to quite different areas of application by programming into the storage means appropriate time space numbers and pulse edge position numbers.

Prior art pulse generators of the type in question are provided with analogue circuit elements and external, time variable control signals are used for the selection of functional modes, which brings with it control problems and limits the obtainable frequency stability and time accuracy. Owing to the fact that the corresponding selection in a pulse generator embodying the invention is performed by means of fixed signal codes, the external control is considerably simplified and marked improved frequency stability and time accuracy are made possible in consequence of the fact that all time control of this type is performed internally and is dependent only on the control frequency. By using high speed digital circuits, for example Schottky TTL, in a pulse generator embodying the invention, a time accuracy of the order of nanoseconds may be obtained.

Said first unit may be provided with third storage means in which modification numbers for modifying said time space numbers are stored in selectable positions, the actual modification number and time space number being combined in a logic circuit the output signal of which is supplied to said first sequential circuit so as to determine the operation cycle thereof.

By adequate control of the address selection in said third storage means, the relevant time space number, which determines the PRF, may be modified in different ways. Accordingly a jittering mode may be obtained by random control of the address selection within an area of said storage means comprising modification numbers which determine a jittering area around the nominal PRF. For example, a noise controlled address counter may be used for this random control of the third storage means.

The introduction of said third storage means furthermore makes possible an optimal adaptation of the PRF to eliminate Doppler blind speeds and range ambiguity. This may be obtained by controlling the address selection in said third storage means via an external control loop, which may comprise a computer which is supplied with information about actual PRF and received radar information and which, dependent thereon, will generate an address to one specific, desired storage position. Such a memory position comprises a modification number in the form of a compensation number, which in combination with the actual time space number supplied by the first storage means will provide the compensation of the PRF which is determined by the computer calculation.

The functional mode with PRF staggering may be obtained by providing said first unit with a step-by-step controlled address counter and an address logic circuit which is controlled thereby for addressing said first storage means by means of addresses within a set of addresses for a specific storage area, which area is determined by a mode selection code supplied thereto, and in which said address counter is arranged so as to be stepped once per each generated pulse group, for example dependent on a O-sync signal appearing in the pulse group, and to generate thereby an output signal which by means of said address logic circuit will initiate a jump to a new address within said set. Different storage areas may be selected by the supply of different mode selection codes and thereby the staggering may have a different character.

BRIEF DESCRIPTION OF THE DRAWING

An embodiment of the invention, intended for use in a radar system, will now be described, by way of example, with reference to the drawings, in which.

DESCRIPTION OF THE PREFERRED EMBODIMENTS

Figure 1:
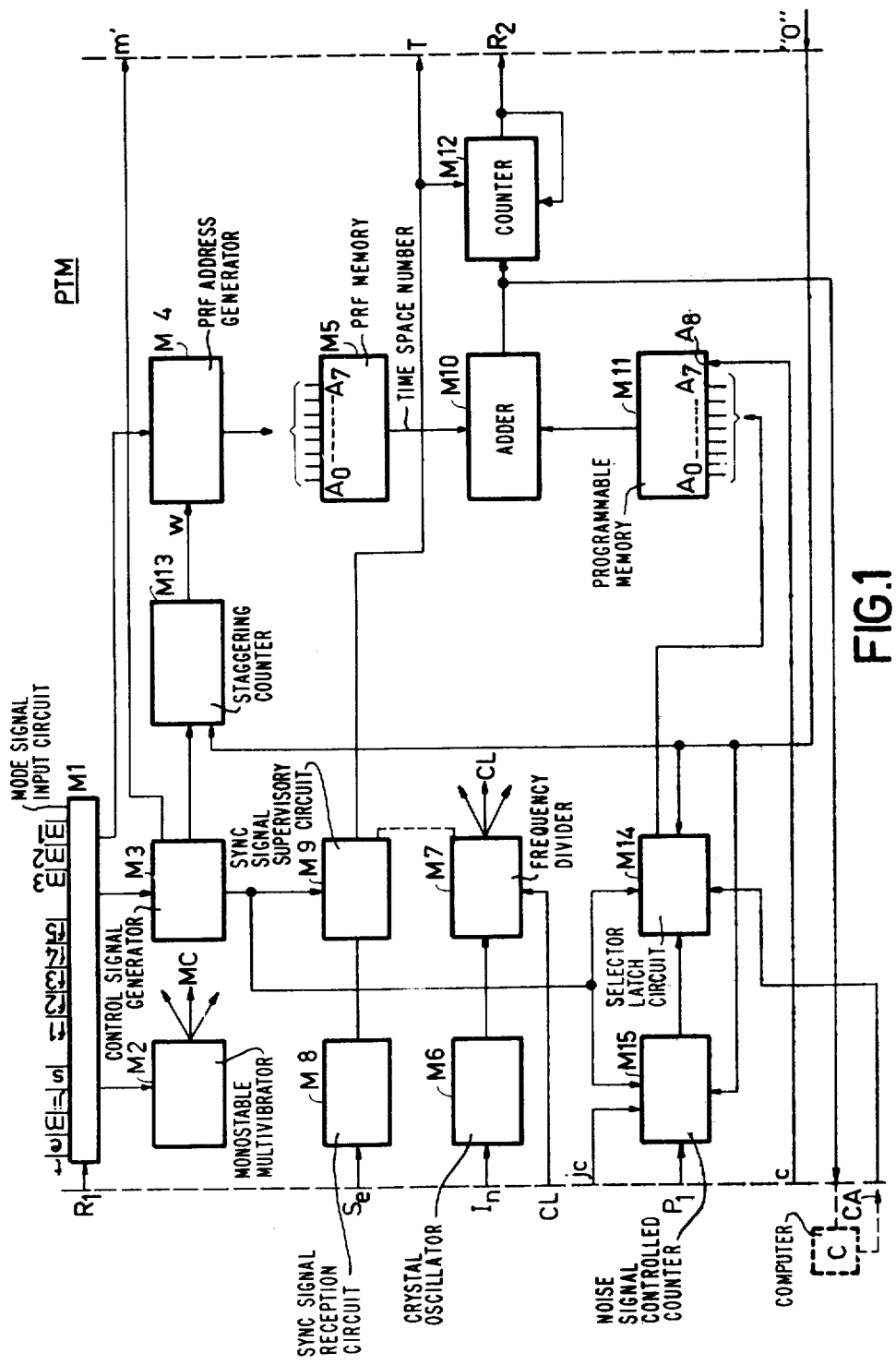
FIG. 1 and 2 are respectively block diagrams of the two main units PTM and PTL of a pulse generator embodying the invention.
Figure 2:
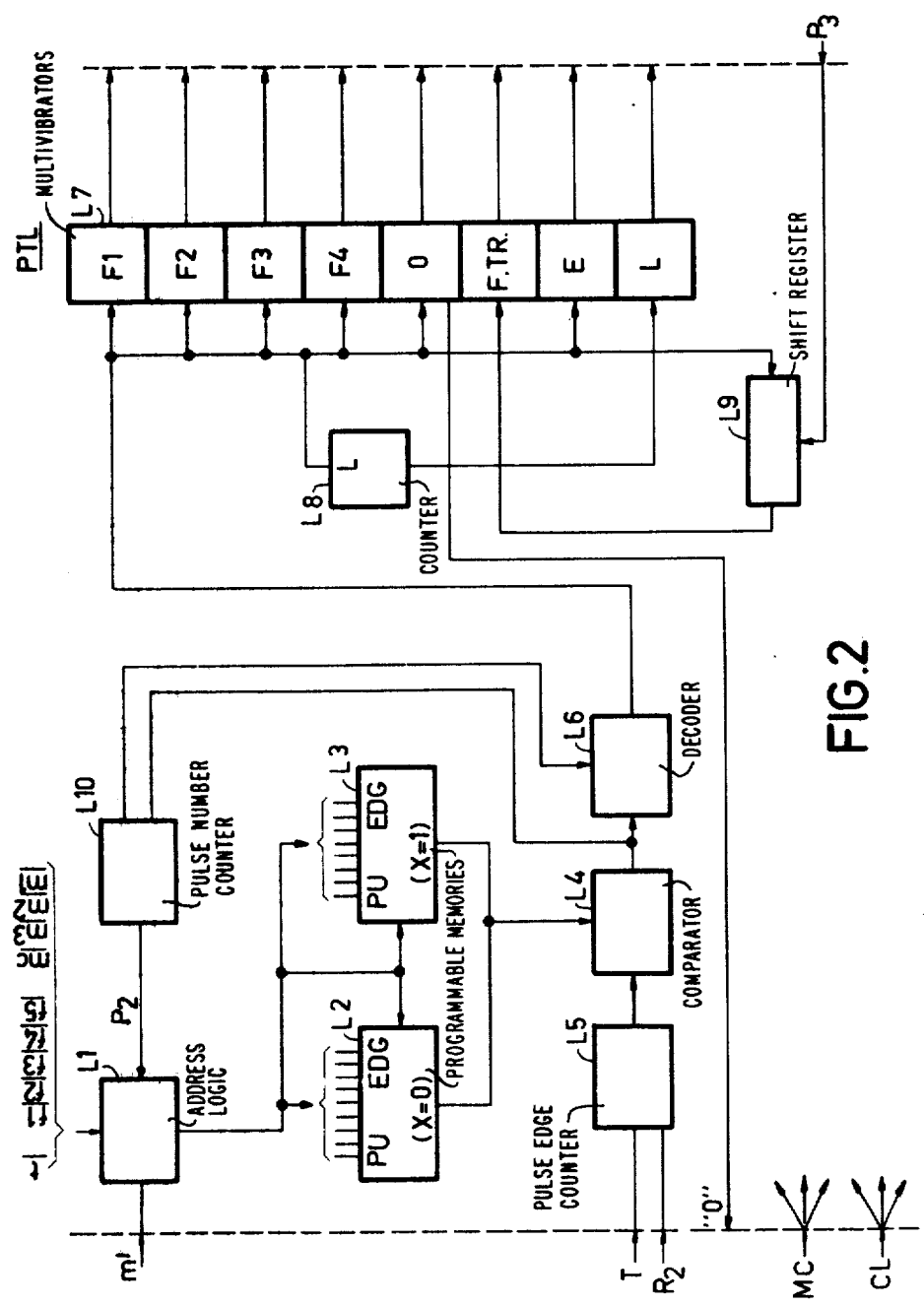

FIGS. 1 and 2 together constitute a block diagram of a pulse generator embodying the invention, intended for use in a MTI radar system for the generation of necessary trigger and sync pulses. The pulse generator is built from two main units, PTM (FIG. 1) and PTL (FIG. 2), respectively. The PTM unit determines the PRF of the radar, which may be changed by selectable, externally supplied operation mode signals, said PRF corresponding to the time space between the pulse groups which are generated by the PTL unit under the control of corresponding operation mode signals.

Figure 3:
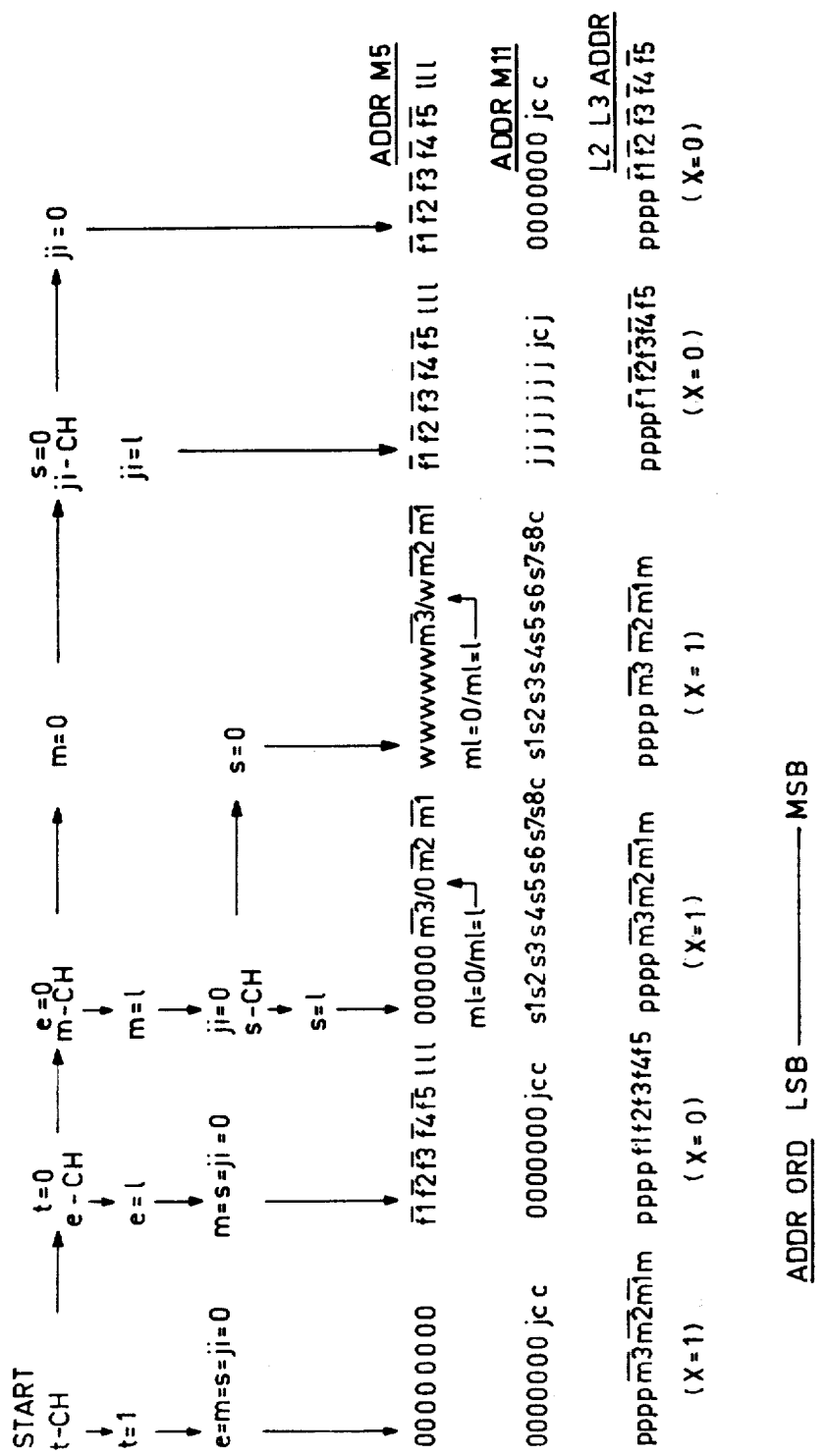
FIG. 3 shows a priority diagram of the mode signals and the addresses formed therefrom for the PROM memories comprised therein.

The PTM unit shown in FIG. 1 comprises a mode signal input circuit M1 having inputs for the reception of said mode signals which are denoted t, e, m, ji, s, f1-f5 and m1-m3, respectively. The significance of said mode signals will be described more closely below in connection with FIG. 3 showing a priority diagram of the mode signals. The block M1 is built so as to supply a trigger signal to the block M2 when the mode signals are changed, the latter block comprising a monostable multivibrator which will then generate a so-called MASTER CLEAR signal MC which is supplied to relevant internal and external circuits. The MC signal has the effect that the pulse generator is reset to a start position. To block M1 is also supplied the signal R1, which is generated when the supply voltage to the generator has reached a correct level and which initiates the generation of a MASTER CLEAR signal.

The mode signals supplied are converted in block M3 to a set of control signals for the pulse generator. Some of the blocks comprised in the generator are then supplied with address signals in accordance with said piority diagram (FIG. 3) from which diagram it follows that "unallowed" control signals are suppressed automatically.

Dependent on the mode signals the address logic block M4 is controlled so as to generate addresses for positions in the PRF memory M5. This memory is programmable and comprises the time space numbers mentioned in the introductory part of the description.

For generating the control frequency the PTM unit comprises a crystal oscillator M6 which may oscillate at the frequency 40 MHz, the output signal thereof being divided down in a subsequent frequency divider M7 at the output of which necessary clock signals CL for different functions in the pulse generator are available. For the sake of clarity clock signal lines used have been omitted in the Figure. For functional tests, among other things, the control frequency CL may also be generated externally and supplied to the frequency divider M7, and if so an inhibiting signal In is simultaneously supplied to the crystal oscillator M6.

In order to determine the time space between generated pulse groups (the PRF of the generator) an externally generated sync signal Se may also be used, which is then supplied to a sync signal reception circuit M8 tolerating external pulse trains showing significant variations in voltage level and pulse width. When the pulse generator is controlled by an external sync signal, it is supervised by the block M9 so that the time space between pulse groups does not fall below the value determined by the particular mode signals supplied. Block M9 also generates a stepping signal T which is supplied to sequential circuits comprised in the PTM and PTL units dependent on clock pulse information supplied to the circuit M9 by the frequency divider M7.

As mentioned above block M4 generates addresses for memory M5, which in accordance with a received address will supply to an adder M10 a time space number. Said adder is connected via a second input to a further programmable memory M11, in which so-called modification numbers are stored. In accordance with an address supplied to memory M11 a modification number is discharged which in adder M10 is added to said time space number and the sum thereof is used for presetting a counter M12 providing the first sequential circuit mentioned in the introduction. The counter M12 counts down from the preset value dependent on the stepping signal supplied by the block M9. When said counter has counted down to zero a reset signal R2 is generated, which signal on the first hand will reset counter M12 to the preset number supplied thereto and which on the second hand is supplied to the PTL unit in order to reset the second sequential circuit comprised therein. Said reset signal R2 at the same time provides for the time space pulse mentioned in the introductory part of the description.

In order to make possible staggering of the PRF the PTM unit furthermore comprises a staggering counter M13 which is advanced by means of a "O" sync signal comprised in the generated pulse group. When the counter M13 advances, a signal w is generated, which is supplied to the address logic circuit M4 and which therein initiates a jump between different addresses within a memory area in memory M5 and a step-by-step read cut of the corresponding time space numbers. It is evident that this brings with it a corresponding step-by-step change in the preset number for counter M12 and accordingly an incremental change in the radar PRF.

As appears from FIG. 1 the memory M11 may be addressed in two ways dependent on a block M14 comprising a selector-latch circuit, that is on the first hand the address (j) which is obtained from the noise signal P1 controlled counter M15 and on the other hand a compensation number address CA, which is calculated by external means which may, for example, comprise a computer (C), as is schematically indicated in FIG. 1, to which the actual preset number of counter M12 is supplied. The noise controlled counter M15 comprises a counter to which is supplied an external noise signal P1 and which is clocked at a high frequency and which continuously calculates address values for the memory M11. This noise control may be such that the counter is advanced if the noise level is above a given threshold level at the appearance of the advancing pulse.

By using said computer C to which the time position of the pulse group is supplied by the adder M10, a closed control loop is obtained making possible accurate adjustment of the radar PRF by using the address CA for memory M11. However, the operation of the computer for carrying out this will not be considered. When the address for memory M11 is generated by the noise controlled counter M15, the radar system will operate in a jumping frequency mode while the address will vary randomly within a determined range of values corresponding to a storage area in memory M11. By selection of the mode signals jc and c different areas may be selected comprising jittering numbers which are supplied to the adder M10.

The input signals to adder M10 must be latched in a stationary state when counter M12 is to be preset. When the staggering counter M13 is activated jumps are performed between different addresses within the time space number memory M5 which supplies to the adder M10 time space numbers at the corresponding rate. Latching of this input signal to M10 may be obtained by advancing counter M13 dependent on a O sync pulse ("O") in the pulse group generated, which is obtained from the PTL unit (FIG. 2). Address information for the memory M11 and consequently the corresponding modification number are latched by means of the selection-latch circuit M14 dependent on said O sync pulse. As a result of this control dependent on said O sync pulse of the generated pulse group, the output signal of adder M10 is always stationary at a time when counter M12 is to be preset.

FIG. 2 shows the PTL unit to which are supplied some of the same mode signals as to the PTM unit. In contrast to the PTM unit, in which said mode signals determine the PRF features of the radar system, the mode signals are in this case determinative of the time positions of the pulse edges and thereby the pulse widths and pulse distances of the pulses within a pulse group. The mode signals which in the PTM unit indicate the jittering, staggering and external synchronization (ji, s, e) operation modes and which relate to changes of the PRF are consequently not used by this unit. In addition to said signals, the PTL unit is supplied with a version of the MTI mode signal m modified by the priority logic circuit M3, which modified signal is denoted m'.

Said mode signals are supplied to an address logic circuit L1, which dependent thereon generates addresses for memories L2 and L3 ($X=0 \cdot X=1$), said memories being programmable and capable of storing pulse edge position numbers. The character X is dependent on said signal m' and the mode signal t in such a manner that when the PTL filter test mode signal $t=1$, and $X=1$, L3 is selected, and that when $t=0$, L2 is selected when $m'=1$ ($X=0$) and L3 when $m'=0$ ($X=1$).

The pulse edge position numbers from L2 and L3 are supplied to one input of a comparator L4 which at a second input is supplied with the output signal from a pulse edge counter L5 constituting the second sequential circuit mentioned in the introduction.

Counter L5 is reset to zero by the time space pulse R2 supplied by counter M12 of the PTM unit. After being reset, counter L5 is advanced continuously by the stepping signal T supplied by the block M9 of the PTM unit during the time space to the next following pulse group, after which L5 is again reset to zero by said time space pulse.

The continuously changed number in counter L5 is compared in comparator L4 with the actual edge position number from L2 or L3. At correspondance, L4 generates an output signal for a decoder L6, from which in turn a signal is supplied to pulse generator means L7, L8, L9 for generating pulses F1, F2, F3, F4, O, F, TR, E and L in each pulse group.

The decoder L6 is also controlled by the output signal from a pulse number counter L10 the position of which indicates which of the pulse generator means is to be activated by the output signal of the decoder and whether it is a front edge or back edge of pulse in question. The pulse number counter L10 is advanced one step every time an output signal is received from the comparator circuit L4 whereby the output signal $P_2$ thereof is changed. This output signal $P_2$ is supplied to the address logic circuit L1 and the advancement of counter L10 results in L1 generating a new address for memories L2 and L3, which will thereby supply the next following pulse edge number to the comparator circuit L4.

Said pulse generator means comprise a set of multivibrators (L7) which are denoted in correspondance with the respective pulses they generate, that is F1, F2, F3 F4, O, F.TR, E, L. Furthermore a counter L8 and a shift register circuit L9 are provided in said pulse generator means.

Pulses F1-F4 and O are generated in the same manner during a successive feed out of edge position information of front and back edges from memories L2 or L3. When generating the next following pulse F.TR, which is used for triggering MTI filters comprised in the radar system, the associated edge position information supplied by the decoder L6 is not directly supplied to the multivibrator F.TR but instead via the shift register circuit L9. L9 and counter L5 are advanced synchronously and dependent on a control signal $P_3$ supplied to L9, edge position information may be tapped off with a delay equal to a desired number of steps and supplied to the multivibrator F.TR. The pulse is thereafter generated in the same manner as the pulseses described above. By the introduction of circuit L9, it is possible to obtain accurate trimming of the position of the F.TR pulse within the pulse group and in relation to further pulses.

The next following edge position information from decoder L6 is supplied to counter L8 the purpose of which is to activate the multivibrator for the pulse L. Counter L8 is preset thereby to the number value appearing simultaneously on the output memory L2 or L3. The next following edge position information from decoder L6 is used to start the counter L8, which will then start a counting down operation from the preset value to zero in synchronism with the clocking of counter L5.

The next two edge position signals from decoder L6 are supplied to the multivibrator E for generating the front and back edges, respectively, of the pulse E.

Figure 4:
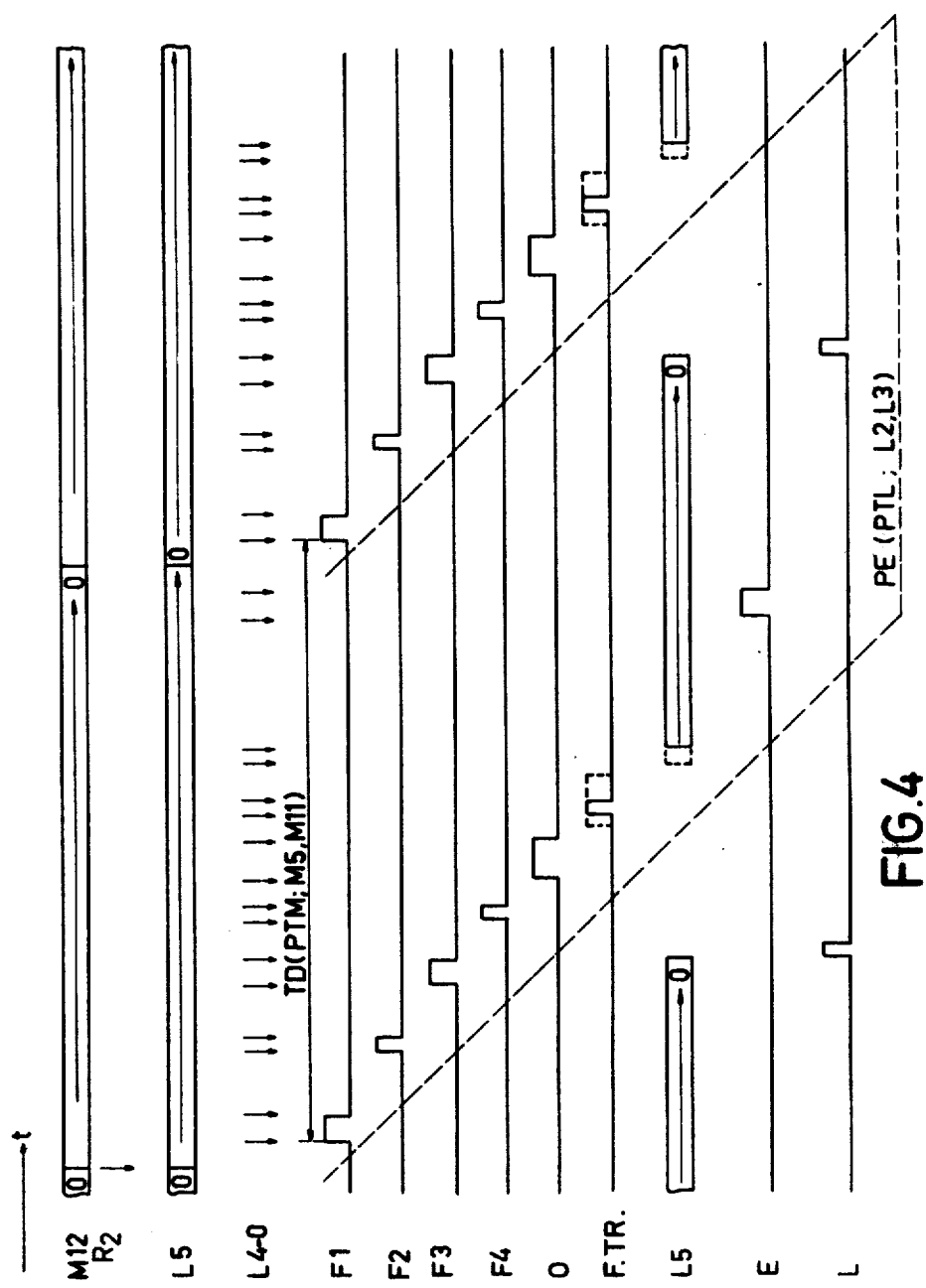
FIG. 4 is a time diagram showing the time positions of the different operations in the pulse generator during the generation of a pulse group.

In this situation a full pulse group has been generated with exception of the pulse L. The pulse number counter L10 has run through its operation cycle and has been reset. The pulse edge position counter L5 is advanced continuously awaiting the next time space pulse from counter M12 of the PTM unit and synchronously the downward counting of counter L8 is proceeding, the latter counter will supply an activation pulse to the L multivibrator when it reaches zero. Thereby, counter L8 will provide for a delayed generation of the L pulse to a time position enclosed by the next following pulse group. This is evident from the diagram of FIG. 4 showing the time positions of the generated pulses. In the radar system said L pulse indicates the end of the "listening interval", that is the time interval during which the system is open for reception of radar information. The listening interval starts at the O sync pulse when the radar pulse is transmitted. In order to achieve a listening interval which is as long as possible said L pulse should appear immediately before said O sync pulse of the next following pulse group, from which follows that the L pulse should have a time position which is enclosed by the so-called presynchronization pulses F1-F4 of said pulse group. By the use of counter L8 this overlap between successive pulse groups is made possible by an L pulse having a time position which is fixedly related to other pulses of the pulse group.

When counter L8 reaches zero, the L multivibrator is activated but unlike other pulses the front edge only is initiated, whereby a pulse having a given pulse width is generated.

FIG. 3 is a priority diagram of the mode signals supplied to the block M1 of FIG. 1 and converted therein into control signals for the units PTM and PTL of the sync generator, and further of the manner in which the addresses for the PROM memories M5, M11 and L2, L3 are built up from the mode signals supplied thereto and further control signals of the pulse generator. From the fixed priority order of the mode signals it follows that non desired control signals are suppressed automatically. The following mode signals are supplied to said units:

t = MTI filter test;
e = external sync;
m = MTI operation;
ji = jittering PRF;
s = end of staggering of the PRF.

Said signals may assume the value 0 or 1, wherein the value 1 means that a relevant mode signal has influence in accordance with the priority order. Furthermore the following signals are supplied thereto:

jc = choice of jittering area in M11;
c = choice of jittering area in M11;
f1-f5 = choice of fixed PRF;
m1-m3 = choice of storage area in M5 for staggering the PRF;
p = output signal of the pulse number counter L10;
j = output signal of the jittering counter M15;
w = output signal of the staggering counter M13.

By giving each of the signals jc and c the value 0 or 1, four different jittering areas in M11 may be selected. By means of f1-f5 it is possible to form $2^5 = 32$ different, fixed addresses to M5 and accordingly 32 different, fixed PRF may be obtained, while f1-f5 corresponding makes possible a choice among 32 storage areas in memory L2 (X=0) of the PTL unit, said storage areas comprising the respective pulse edge position numbers of the PRF which is selected. m1-m3 makes possible a choice of different storage areas in M5, said areas each defining a staggering interval of the PRF, and corresponding storage areas of memory L3.

From FIG. 3 it is evident that the mode signal t = MTI filter test has the highest priority and may be chosen (t-CH) as 1 or 0. t = 1 means that e = m = s = ji = 0 and that M5 is addressed by means of zeros only, said address comprising the time space number of MTI filter test. At the same time the modification number memory M11 is supplied with an address formed by zeros and the mode signals jc and c, while L3 (X = 1) is supplied with an address formed by the output signal p of the pulse number counter L10 and the mode signals m1-m3 and m. If t = 0 it is possible to choose e(e-CH), in which e = 1 means external synchronization of the pulse generator via input Se in FIG. 1, while a fixed address to M5 is obtained dependent on f1-f5 the corresponding time space number of which is used for checking in co-operation with the guard circuit M9 that the external sync pulse frequency is not higher than the PRF indicated by the time space number. From the addresses to memories L2 and L3 of the pulse edge position numbers is clear that L2 is addressed (x = 0), which is achieved by means of the signal m' supplied by the priority logic circuit M3. In this mode, signals f1-f5 determine a fixed time space number in memory M5 and at the same time a storage area of memory L1 in which area an advancement operation is carried out, controlled by the output signal p of the pulse number counter L10.

If $t=e=0$, it is possible to choose m(m-CH). $m=1$ means compulsorily that $ji=0$ and allows a choice of s(s-CH) $s=0$ means choice of a storage area in M5 by means of m1-m3, in which area the different time space numbers are read out step-by-step dependent on the output signal w supplied by the staggering counter M13. In this preferred embodiment m1, m2, m3 may not assume values other than 0,0-; 0,1-; 1,0,0; 1,0,1; 1,1,0 and accordingly five different storage areas of M5 may be selected. This possibility of choice is illustrated in FIG. 3 by the supplementary conditions on the M5 address in the case where $t=e=0$, $m=1$. The choice described, that is $t=e=s=0$, $m=1$, means that the radar system will operate in an ordinary MTI mode with a staggering PRF. If, instead $s=1$, the staggering will disappear and M5 will be addressed by means of a fixed address within the storage area given by m1-m3. This MTI mode may be desirable in order to separate out second time around echoes. In the two last mentioned operating conditions, that is $t=e=0$, $m=1$, $s=1/0$, the modification number memory M11 is addressed by means of the address COMP ADDR (S1, s2, ... s8) supplied by the external computer C, and a storage area of the pulse edge position number memory L3 is addressed by means of m1, m2, m3, m.

The choice $p=e=m=0$ means compulsorily $s=0$ and makes possible a choice of ji in M5 and a storage area in L2 dependent on f1-f5. $ji=1$ means no change in the addressing of M5 and L2, but memory M11 is addressed by means of the output signal j supplied by the noise controlled counter M15 and the signals jc and c, making possible thereby a choice of different jittering number areas in M11. By adding in adder M10 the fixed time space number supplied by M5 and the actual jittering number supplied by M11 the operating mode of a randomly jittering PRF is obtained.

From the bottom of FIG. 3 it is evident that the addresses of memories M5, M11, L1, L3 are given in the order of the least significant bit (LSB) to the most significant bit (MSB) from left to right.

FIG. 4 is a time diagram of the time positions of the different operations in the pulse generator when generating a pulse group F1, F2, F3, F4, O, F.Tr. E, L. The time space (time distance) between the pulse groups is denoted TD and in accordance with what has been mentioned above this distance corresponds to a number value formed by the addition of a time space number and a possibly appearing modification number, said numbers being obtained from M5 and M11 respectively, dependent on the mode signals which are supplied. The pulse group appears within the frame indicated by dashed lines, and the relative positions of the pulse edges PE within the group is determined by actual pulse edge position numbers supplied by memory L2 or L3.

The generation of the pulse group is initiated by the presetting of counter M12 (FIG. 1) by the reset pulse R2 to the number value appearing on the output of adder M10. At the same time counter L5 (FIG. 2) is reset to zero by the pulse R2. At the appearance of the next following pulse from M9 a counting down operation of M12 from the preset value is started, while L5 is advanced at the same rate. When the position of counter L5 corresponds to the number on the output of L2 or L3, the comparator L4 supplies an output signal L4-O which is indicated in FIG. 4 by means of an arrow and whereby the flip-flop F1 is activated by the decoder L6 for generating the front edge of the pulse F1. In a corresponding manner the back edge of F1 is generated thereafter and later on, the front and back edges of the further pre-synchronisation pulses F2, F3 and F4 and the O sync pulse. As mentioned above, for the next following pulse F.TR., the relevant flip-flop is activated via the trimming device L9, making possible a trimming of the pulse position with respect to other pulses, with the pulse width maintained constant dependent on the control signal P3. In FIG. 4 this trimming feature is indicated by a dashed line time interval around the pulse F.TR. The next following output signal from L4 (L4-O) relates to the front edge of the L pulse and initiates a preset of counter L8 to the number appearing simultaneously on the output of L2 or L3. The next output signal from L4 will start L8, which will thereafter count down at the rate of the clocking of L5. The last two output signals from L4 will initiate the generation of the respective edges of the post-synchronization pulse E. Finally, when counter L8 has counted down to zero, the front edge of the L pulse is generated. As mentioned before, the pulse width of the L pulse is fixed and thereafter no further control of flip-flop L for the generation of the back edge is required. From FIG. 4 is evident that said L pulse has a time position which falls within the next following pulse group; this is made possible by means of counter L8, which so to say doubles the pulse edge position number from L2, L3 which determines the time position of L.

In the embodiment of the invention which is described below, integrated circuits of the standard type TTL and the faster type Schottky TTL are used for the realization thereof, said circuits belonging to the component series 54 and 54S (S=Schottky) or 74 and 74S, said series being well known by the man skilled in the art and manufactured by for example Signetics Corporation and Texas Instruments. Also used are a number of PROM memories from the series MMI manufactured by Monolitic Memories Incorporated. The type numbers of the IC circuits used are shown in the detailed circuit diagrams; for a closer description of the circuit structures reference may be made to the component catalogues published by the manufacturers. Inputs and outputs of the IC circuits are numbered on the drawings in accordance with corresponding abridged data. Circuits comprised in the one and same IC package are denoted by the same number. As is obvious, some of the functional blocks of the PTM and PTL units may be implemented by a man skilled in the art by means of other suitable IC circuits. For this reason, some of the functional blocks are not shown in detail in the drawings.

Figure 5:
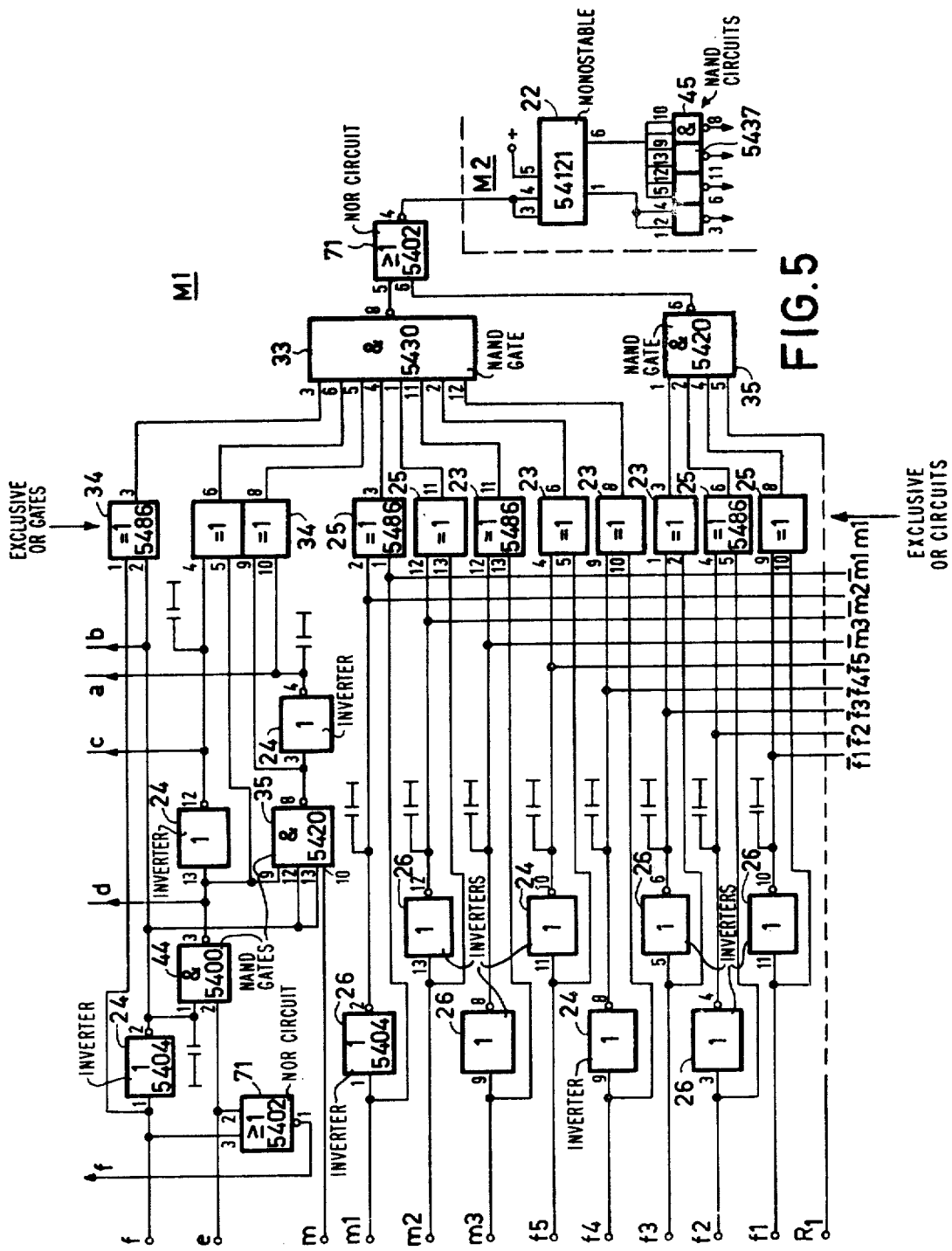
FIG. 5 is a detailed circuit diagram of the mode signal input circuit M1 and the master clear circuit M2 of FIG. 1.

FIG. 5 is a detailed circuit diagram of the mode signal input circuit M1 and the so-called master clear circuit M2 of FIG. 1. As is evident from the Figure the mode signals s and ji are lacking, said signals being supplied to the PTM unit at other places due to circuit technical reasons for the control of gate circuits comprised in the priority logic circuit M3. The object of the circuit M1 is to detect changes in the mode signals supplied thereto and at every change detected to initiate via circuit M2 the reset signal MC to all relevant circuits within the PTM and PTL units. This is achieved by supplying each of the signals m1-m3, f1-f5 to a respective exclusive OR circuit (XOR) (=1) both directly to one input and via an inverter (1) to the other input, whereby the output signal from a XOR circuit will always be influenced but always be high again with a delay determined by a respective capacitor connected to the output of each inverter. The output signals are brought together in a OR function implemented by two NAND circuits (&) 33 and 35 and a subsequent NOR circuit 71 ($\geq 1$). The signal $R_1$, which should always initiate the reset signal MC, is supplied to one input of the NAND circuit 35 via a circuit which is not shown but which comprises an inverter, a capacitor and a XOR circuit connected in a manner which is the same as for the mode signals. The output signal of the NOR gate 71 controls the monostable 22 implementing the block M2 of FIG. 1 and at the output of which a pulse of suitable shape is obtained, Via an output circuit 45 comprising four NAND circuits, MC pulses are distributed to the PTM and PTL units.

FIG. 5 shows one further NOR gate of the IC package 71 and NAND gates 44 and 35, these circuits being comprised in the priority logic circuit M3 and having the task of generating conditions for the realization of the priority order according to the diagram of FIG. 3. According ly the output signal $f_{M1}$ from circuit is supplied to one input of a gate circuit for resetting the noice controlled counter M15 (see below). Of the output signals a, b, c and d the signals a and b are supplied to the address logic circuit M4 (see FIG. 6), while signals c and d are supplied to block M9 (see FIG. 9). The inverted mode signals $\overline{f1}, \overline{f2}, \overline{f3}, \overline{f4}, \overline{f5}, \overline{m3}, \overline{m2}, \overline{m1}$ are used for control purposes and address generation in the address logic circuit M4, while the m1 signal is used for the control of the staggering counter M13.

Figure 6:
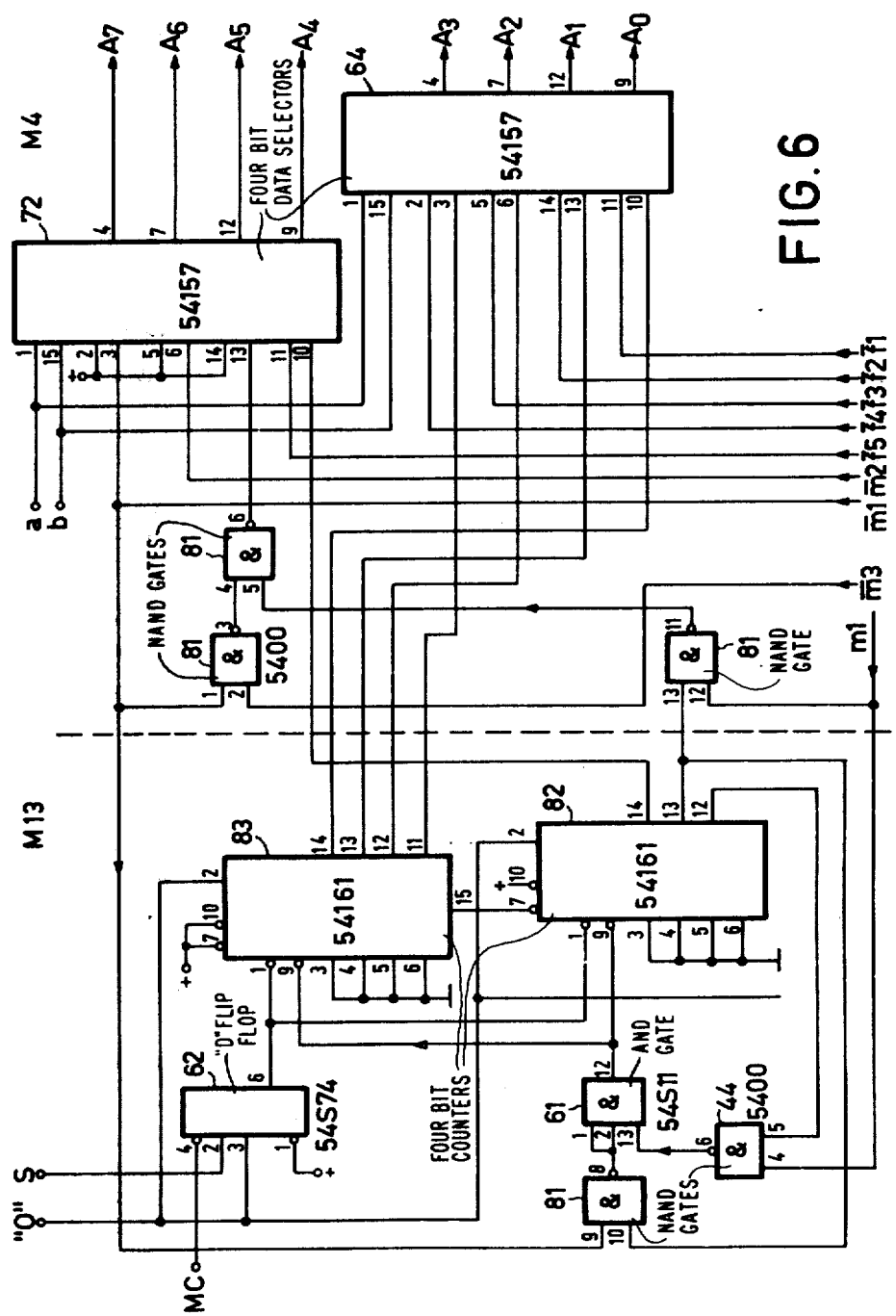
FIG. 6 is a circuit diagram of the staggering counter M13 and the address logic circuit M4 of FIG. 1.

FIG. 6 shows the circuit diagram of the staggering counter M13 and the address logic circuit M4.

Sais staggering counter comprises two 4-bit counters 82, 83, which are advanced by the pulse "0" obtained from the flip-flop O of the PTL unit. The staggering mode signal s is supplied to the respective reset inputs of said counters via a D-type flip-flop 62, which is clocked by said "0"-pulse. When s goes high, the counters are reset for every appearing "0" pulse and thereby the staggering function disappears. Said counters are preset via three gate circuits 81, 61, 44 dependent on the signals $\overline{m1}$, m1 supplied by the block M1 (FIG. 5) and feed back output signals from the counter 82.

The address logic circuit M4 comprises two 4-bit data selectors 72 and 64. By the signal a (corresponding to m' in FIG. 1) from block M1, the input signals on the so-called A- or B-inputs may be chosen as output signal. By means of the signal b (which corresponds to m) all output signals of the data selectors may be made low independent of the input signals, which feature is used for implementing the priority diagram of FIG. 3. The input signals of the data selectors are formed by the signals $\overline{f1}, \overline{f2}, \overline{f3}, \overline{f4}, \overline{f5}, \overline{m3}, \overline{m2}, \overline{m1}$ from M1 and the output signals from counters 82, 83 of M13. On the outputs of counters 82, 83 the address signals $A_0, A_1 .. ., A_7$ for memory M5 are obtained, said addresses being formed by the mode signals in accordance with the diagram of FIG. 3, M5.

The address signals $A_0, A_1, \ldots, A_7$ generated are supplied to memory M5 comprising said time space numbers. M5 comprises four 256×4-bit PROM memories connected in parallel. The connection of said memories is known to a man skilled in the art and therefore not shown in detail. Accordingly, the eight address inputs of each PROM memory are supplied with the eight address signals, whereby the contents of an address memory position is obtained in the form of a 4-bit number on the four outputs of the memory. The 4-bit numbers from each of the four memories together form a 16-bit time space number.

Figure 7:
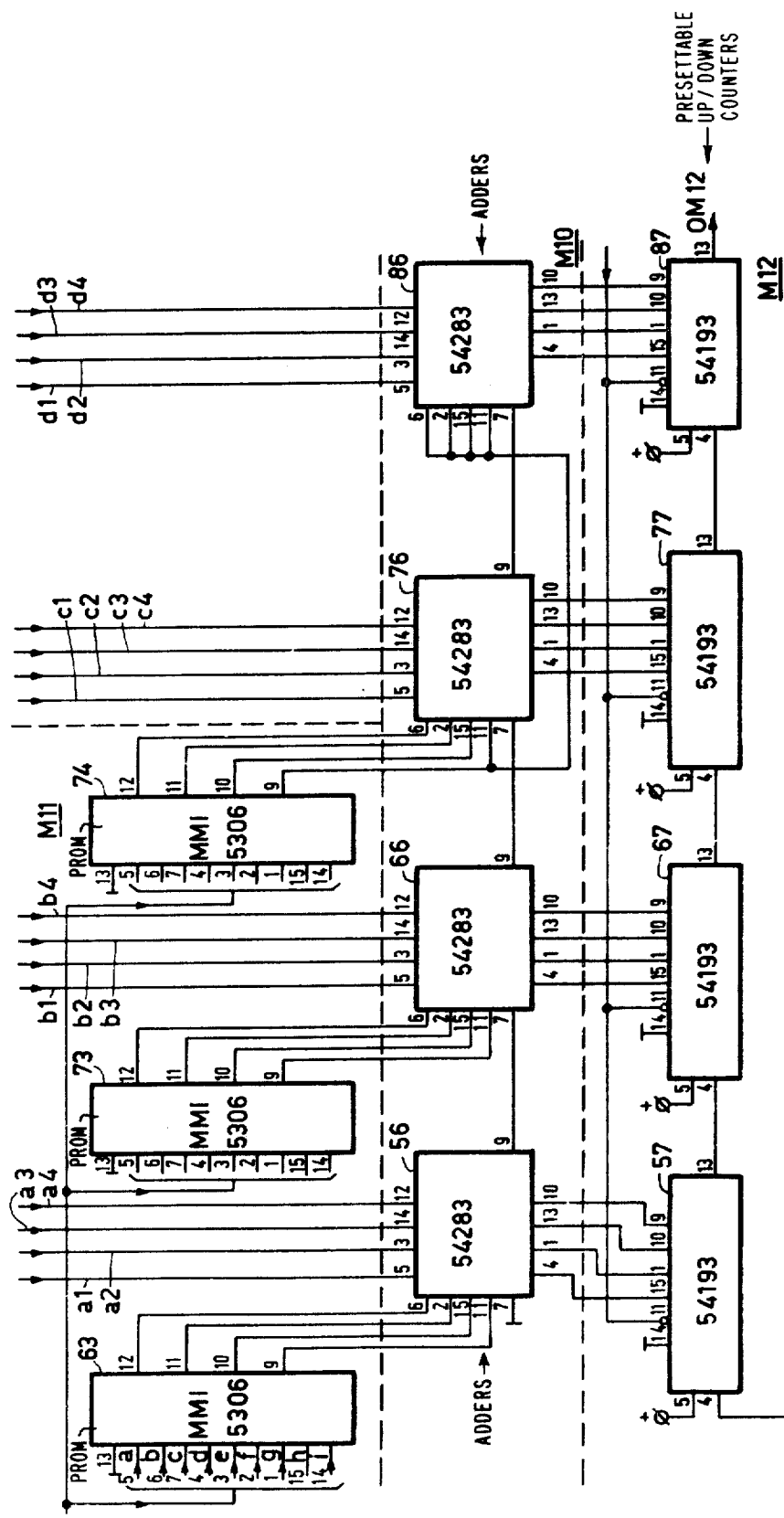
FIG. 7 is a circuit diagram of the modification number memory M11, the adder M10 and the counter M12 of FIG. 1.

FIG. 7 shows the modification number memory M11, the adder M10 and the counter M12 of FIG. 1.

Memory M11 comprises three 512×4-bit PROM memories 63, 73, 74, whose inputs are connected in parallel. As address information the signals $A_0, \ldots, A_7$ are supplied to said PROM memories from the selector-latch circuit M14 (see FIG. 8) and the control signal c (compare FIG. 1). By means of said c signal the desired half of the storage areas of the PROM memories 63, 73, 74 may be chosen. The output signals supplied by said memories are in the manner shown supplied to four inputs of each of four cascaded 4-bit adders 56, 66, 76, 86, forming together said adder M10, while the remaining four inputs of each of said four adders are supplied with the output signals a1, a2, a3, a4; b1, . . . , b4; c1, . . ., c4; d1, . . . , d4; from a respective associated PROM memory comprised in M5.

Counter M12 comprises four presettable 4-bit up/-down counters 57, 67, 77, 87, the respective signal inputs of which are connected to the outputs of the respective associated adders 56, 66, 76, 86 comprised in M10. Said counters are cascaded via counting down inputs (4) and so-called borrow inputs (13). The counting down input of counter 57 is supplied with the signal T from the block M9. The preset inputs (11) of said counters are supplied with the reset signal $R_2$, which in fact corresponds to the output signal OM12 on the borrow output (13) of counter 87, but which according to the following description in reality is generated by the guard-control circuit M9.

Figure 8:
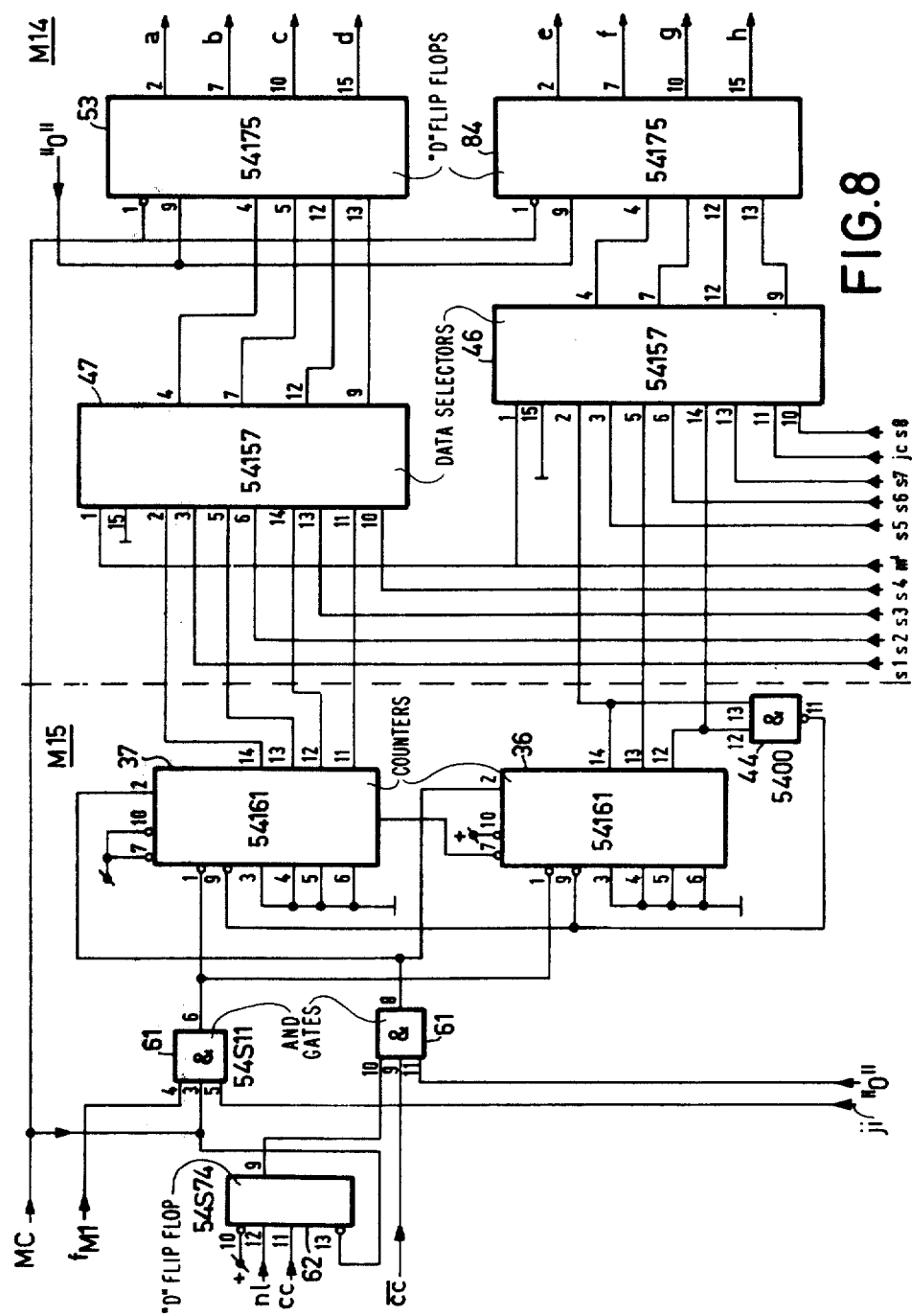
FIG. 8 shows the arrangement of the noise controlled counter M15 and the selection latch circuit M14 of FIG. 1.

FIG. 8 is the circuit diagram of the noise controlled counter M15 and the selector-latch M14.

M15 comprises two cascaded 4-bit counters 36, 37 the clock pulse inputs (2) of which are supplied with the output signal from an AND gate 61 having three inputs. To the inputs of said AND gate the "0" sync signal from the PTL unit (see FIG. 2), a clock signal $\overline{cc}$ from the frequency divider M7, and the output signal from a D-type flip-flop 62 are supplied, the signal input (12) of said flip-flop 62 being supplied with the signal $P_1$ which is obtained from a not shown noise fed amplifier and the level of which depends on the momentary value of the noise level, and to the clock input of which the signal cc from M7 is supplied. The output signal of said D-type flip-flop will accordingly go high or low at an appearing cc pulse dependent on the instantaneous value of said noise, this condition determining also whether or not the AND condition of the AND gate 61 is obtained when a "0" sync pulse appears, and accordingly whether or not counters 36, 37 are advanced for a given "0" sync pulse. Two data selectors 46, 47 of the selector-latch circuit M14 are supplied with the noise dependent values of the counters. Preset adjustment of said counters is initiated by the NAND gate 44. M15 further comprises another AND gate 61 the output of which is connected to the reset inputs of the counters 36, 37. Said AND circuits is supplied with signal $f_{M1}$ from M1, the MC signal from M2 and the mode signal ji, whereby conditions according to the priority diagram of FIG. 3 is fulfilled.

In said selector-latch circuit M14 are comprised the data selectors 46, 47 and 4+4 D.type flip-flops of the packages 53 and 84, respectively. The A inputs of said data selectors are connected to the outputs of counters 36, 37 and the B-inputs thereof are supplied with signals provided by the computer C (see FIG. 1) which is arranged in an external loop for the generation of addresses to memory M11. By means of the modified mode signal m' supplied thereto and obtained from block M1, said A or B input signals are chosen as output signals. By the control signal jc supplied to the data selector 46, two different jittering number areas in memory M11 may be selected.

At the outputs of the D-type flip-flops in 53, 84 are obtained the address signals a, b, c, d, e, f, g, h for memory M11. The D-type flip-flops are switched dependent on the "0" sync signal, whereby the address information intended for M11 is "latched" between the "0" pulses.

Figure 9:
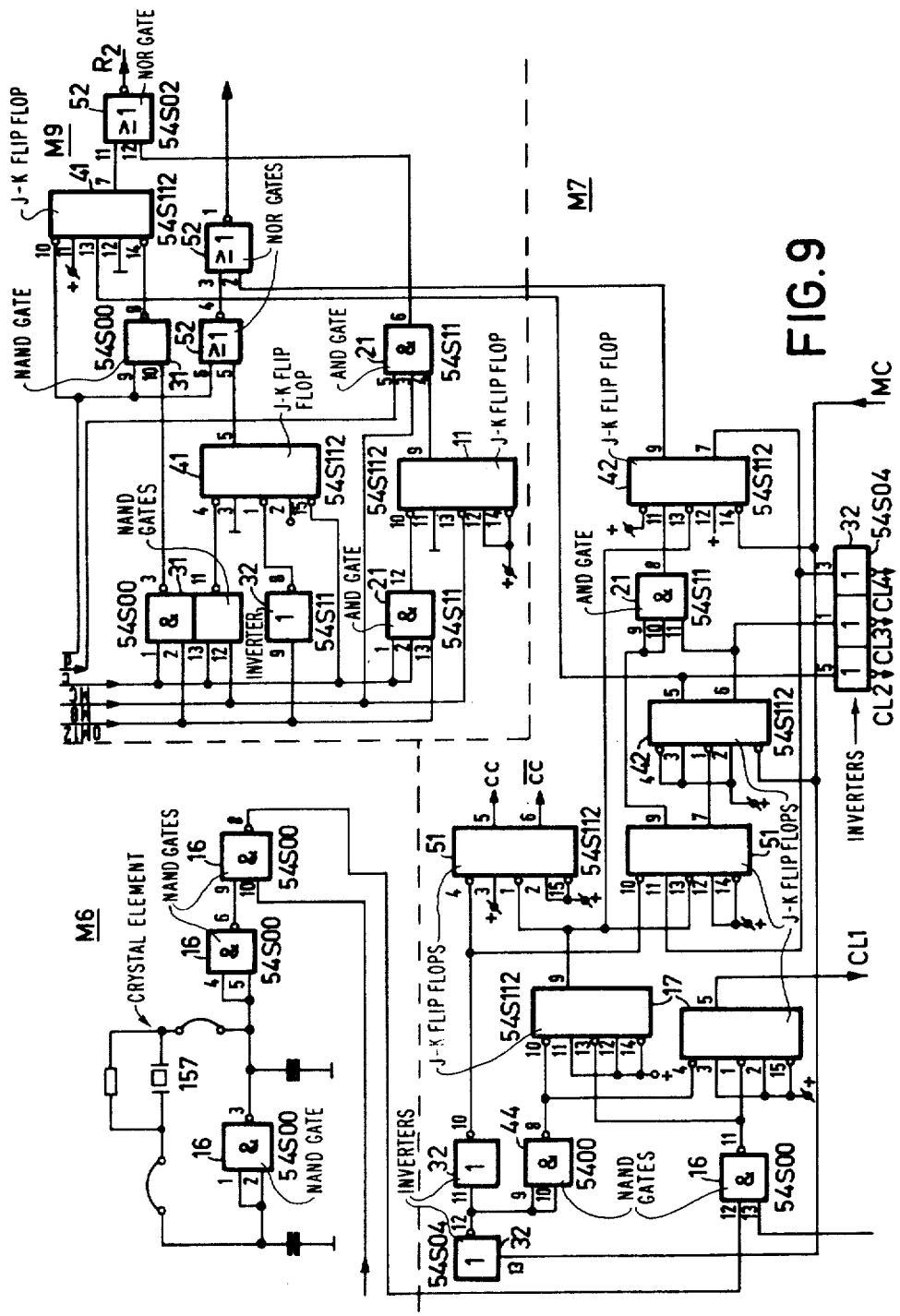
FIG. 9 is a circuit diagram of the crystal oscillator M6, the frequency divider M7 and the guard control circuit M9 of FIG. 1.

FIG. 9 shows the crystal oscillator M6, the frequency divider M7 and the guard-control circuit M9 of FIG. 1.

M6 comprises a crustal element 157 and three NAND gates of the package 16. To the output NAND gate the signal generated by said crystal and the inhibiting signal In (see FIG. 1) are supplied, whereby the crystal output signal may be inhibited when the pulse generator is externally synchronized.

M7 comprises an input NAND gate 17 to which are supplied the oscillator M6 output signal and an external clock signal CL. M7 furthermore comprises six JK flip-flops, comprised in packages 17, 51, 42 and being connected as shown on the drawing for generating desired clock pulses CL1, CL2, . . . CL4, and further clockpulses cc, $\overline{cc}$ which are supplied to the noise-controlled counter M15 (FIG. 8). Signal MC is used for resetting the flip-flops 42 and for presetting the flip-flops 17 and 51 via a gate circuit comprising two inverters 32 and a NAND gate 44.

The output signals of flip-flops 42 are supplied to the guard-control circuit M9. M9 is furthermore supplied with the output signal OM12 (see FIG. 7) from counter M12, the external sync signal Se after being shaped in block M8 (see FIG. 1), the MC signal from M2, output signals, c, d from the priority logic circuit (see FIG. 5), and clock signals from the two last stages 42 of the frequency divider M7 M9 is built from three JK-flip-flops comprised in the packages 11 and 41, three NOR gates of the package 52, four NAND gates of packages 21, 31 and an inverter 32 connected as shown. The signal R$_2$ which indicates the time space between pulse groups and which in FIG. 1 is shown in a simplified manner in the form of an output signal from counter M12, is in fact generated, as already mentioned, by M9 and corresponds to the output signal OM12 of counter M12. Externally synchronized operation is supervised by M9 so that the time space does not fall below the value appropriate to a selected mode. If necessary, external sync signals appearing too early are suppressed by M9. The stepping signal T for counters M12 and L5 is also generated by M9.

Figure 10:
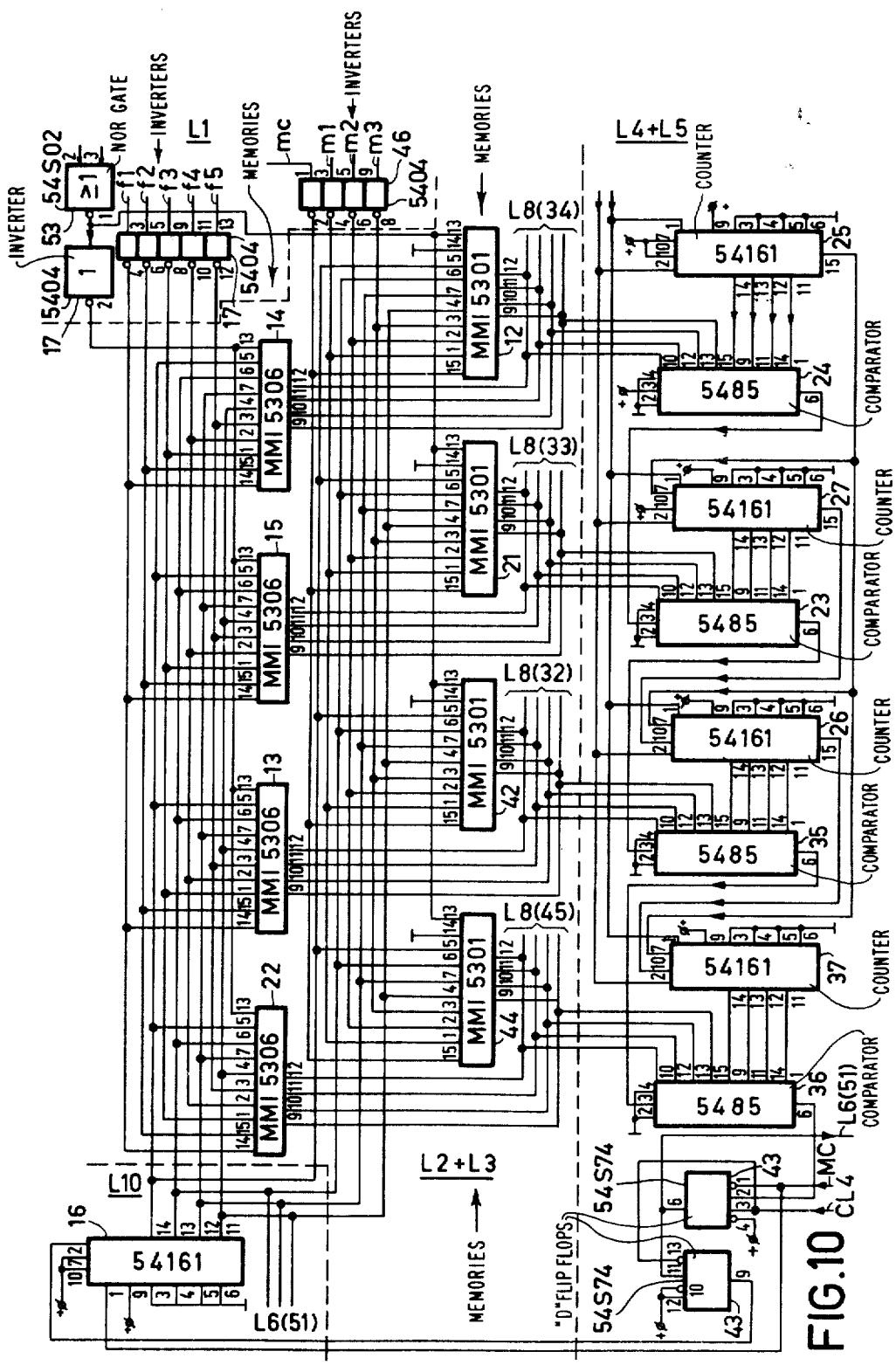
FIG. 10 is a circuit diagram of the address logic circuit L1, the pulse number counter L10, the pulse edge position number memories L2, L3, the pulse edge counter L5 and the comparator L4 of FIG. 2.

FIG. 10 shows the address logic circuit L1, the pulse number counter L10, the pulse edge position number memories L2, L3 the pulse edge counter L5 and the comparator L4 all of which are comprised in the PTL unit of FIG. 2.

The address logic circuit L1 comprises a first set 17 of five inverters supplied with the fixed PRF mode signals f1, f2, f3, f4, f5, which, after being inverted, are supplied as address signals to four 4×512-bit memories 14, 15, 13, 22, whose inputs are connected in parallel and which are comprised in L2; L1 further comprises a second set 46 of four inverters to which are supplied the MTI mode signals mc, m1, m2, m3, which, after being inverted, are supplied as address signals to memory L3 comprising four 4×256-bit memories 12, 21, 42, 44 connected in parallel. The address logic circuit furthermore comprises a NOR gate 53 and an inverter 17 connected in series therewith for selection of L2 or L3 dependent on the signals t and m'. Further address information for L2, L3 is supplied from the pulse number counter L10, comprising a 4-bit binary counter 16 which is clocked by a D-type flip-flop 43 comprised in the comparator L4.

Dependent on the output signal X from said NOR gate 53 of the address logic circuit L1, the memory L2 or, alternatively, L3 is selected to supply pulse edge position numbers to four inputs of four cascaded 4-bit comparators 24, 23, 35, 36 comprised in L4. Sais numbers are also supplied to an L counter L8 (see FIG. 12) in order to preset therein a 4-bit up/down counter. Four other signal inputs of said 4-bit comparators are supplied with the output signals from a respective one of four cascaded 4-bit counters 25, 27, 26, 37 comprised in the pulse edge counter L5, which is advanced by the signal T supplied by the PTM unit and which is reset to zero after the generation of each pulse group by means of signal R$_2$. The comparator L4 furthermore comprises two D-type flip-flops in the package 43, said flip-flops being triggered by the output signal from comparator 36 of L4 and initiating thereby advancement of the pulse number counter L10 dependent on the clock signal CL4 supplied by the frequency divider M7 (see FIG. 9).

Figure 11:
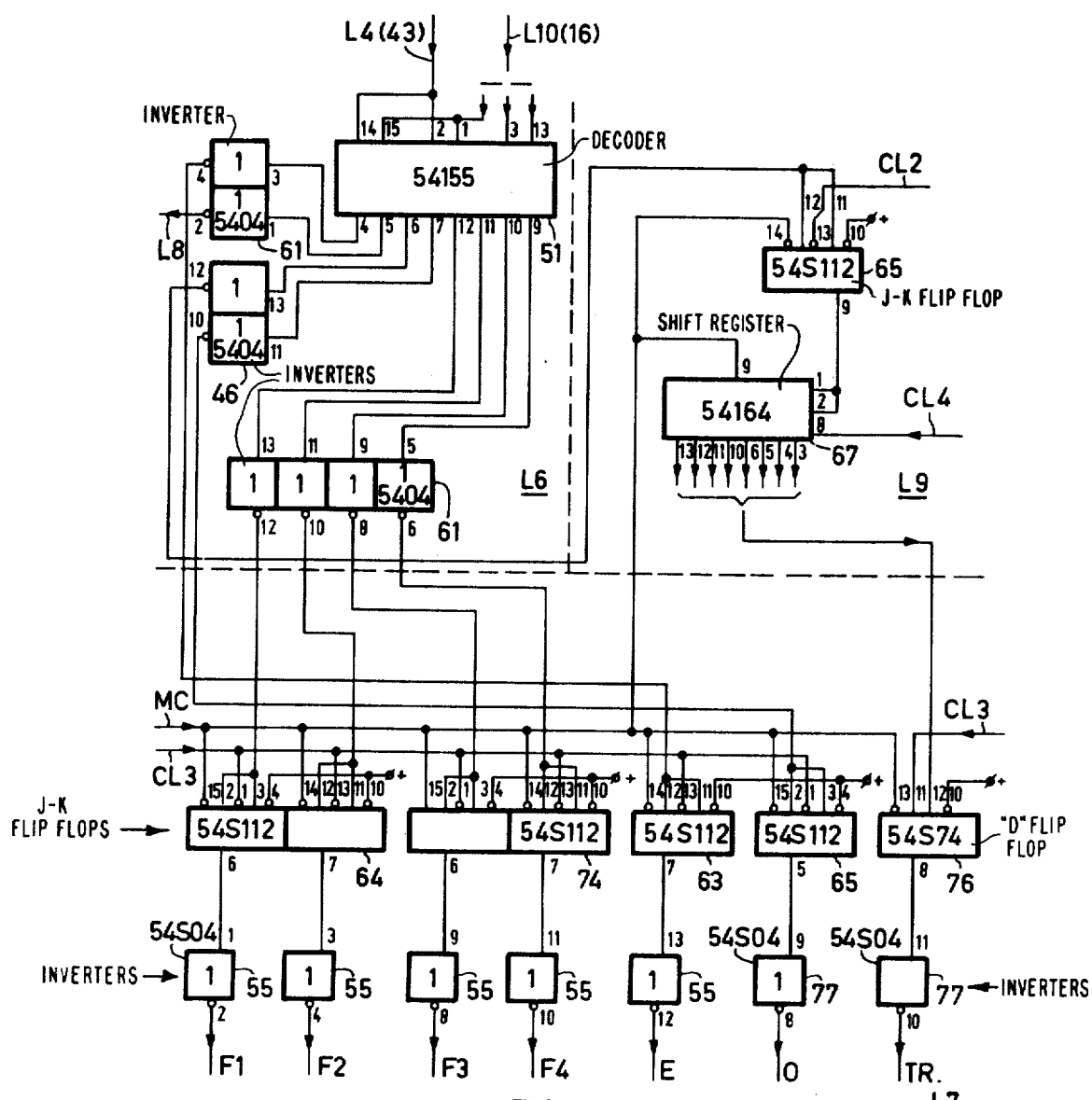
FIG. 11 is a circuit diagram of the decoder L6, the trimming circuit L9 and pulse generator means comprised in L7 of FIG. 2.

FIG. 11 shows the decoder L6, the trimming circuit L9 and the means for generating the pulses F1, F2, F3, F4, O, F.TR. and E comprised in L7.

The decoder L6 is provided with a decoding circuit 51 to which is supplied control information from the pulse number counter L10 and from the comparator L4 (see FIG. 10). For a correspondence output signal from L4 the decoding circuit provides an output signal on one of its outputs, said outputs being connected via associated inverters comprised in packages 61, 46 to JK inputs of respective bistable JK flip-flop comprised in L7, L8, L9. Thereby is made possible activation of a desired flip-flop dependent on the position of the pulse number counter L10 and the output signal from the comparator L4.

For the generation of the pulses F1, F2, F3, F4, O and E of the pulse group, L7 is provided with six identical circuits each comprising a JK flip-flop in packages 64, 74, 63, 65 and an inverter comprised in packages 55, 77 as output circuit. In addition to the signals from L6, each flip-flop is supplied with the signal MC and the clock signal $\overline{CL3}$. The flip-flops are so connected as shown in the drawing that a flip-flop is reset each time an address signal from L6 and said $\overline{CL3}$ signal appear simultaneously.

L9 is provided with a JK flip-flop 65 the JK inputs of which are supplied with control information from an output of L6 and the clock signal input of which is supplied with the clock signal CL2. When the programmed time position of the front edge of the F.TR. pulse appears, the JK flip-flop is set by the signal from L6 and the signal CL2. A pulse is then supplied to a shift register 67 which is thereafter advanced by means of the clock signal CL4. Said pulse appears successively on the parallel outputs of said register, and by selecting a desired output by means of a switching device which is not shown and which is controlled by the signal P$_3$ as indicated in FIG. 2, the D-type flip-flop 76 of L7 may be switched over by said pulse with a delay relative to the programmed time position which is equal to a selected number of advancements of shift register 67. In the same manner the back edge of the F.TR. pulse is delayed. Thereby a desired trimming of the position of said F.TR pulse with respect to other pulses of the pulse group is obtained.

Figure 12:
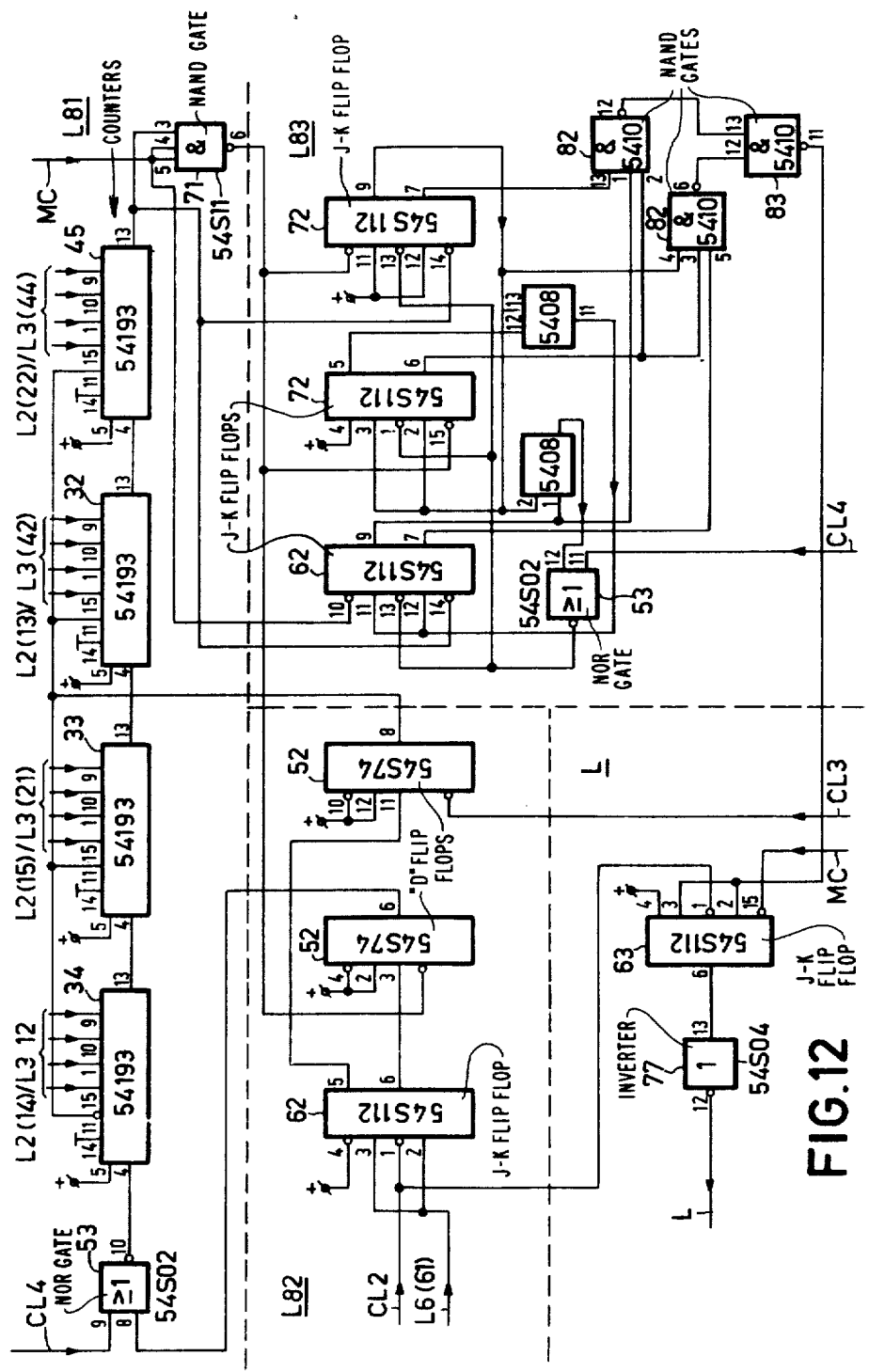
FIG. 12 is a circuit diagram of the L counter L8 and the pulse gerenator means L controlled thereby and comprised in L7 of FIG. 2.

In FIG. 12 the L counter L8 is shown as being separated into three functional elements L81, L82, L83; the Figure also shows the pulse generator means L comprised in L7 and controlled by L8.

L81 is provided with four cascaded 4-bit counters 34, 33, 32, 45, which as shown in the drawing are supplied with preset information from memory L2 or L3, depending on the running mode of operation. L81 counts down from the preset value to zero being triggered by means of clock pulse CL4, which is supplied via a NOR gate 53 also supplied with the output signal from a D-type flip-flop 52 comprised in L82. Said D-type flip-flop 52 is controlled by the clock signal CL3 and the output signal from a JK flip-flop 62, which in turn is controlled by the clock signal CL2 and address information supplied by decoder L6. Consequently, the JK flip-flop is reset when addressed from L6, which in turn results in the D-type flip-flop 52 being reset, the output signal of which will then allow feeding-in of the preset signal into L81 and opening of the gate 53 for the clock signal CL4, respectively, so that counting down of L81 form the preset value may be started.

When the zero position is reached by counter L81 the functional element L83 is initiated by the output signal from the 4-bit counter 45.

L83 is built from three JK flip-flops 62, 72, 72 and AND gates and a NOR gate as shown in the drawing. Besides the output signal from counter L81 the clock signal CL4 is supplied to L83. L83 determines the width of the L pulse and is built in the form of a counter, which supplies a first output signal on the output of AND gate 83 when the output signal is supplied by L81, and a second output signal with a time delay which is determined by the circuit and the CL4 clock signal supplied thereto. The output signal from L83 is supplied to a JK flip-flop 63, connected to an inverter 77, both comprised in the pulse generator means L which is thereby initiated to generate the front and back edges respectively, of the L pulse. From this it follows that L8 allows the generation of the listening pulse L with a time position such that the first pulses of the succeeding pulse group have already been generated.

Figure 13:
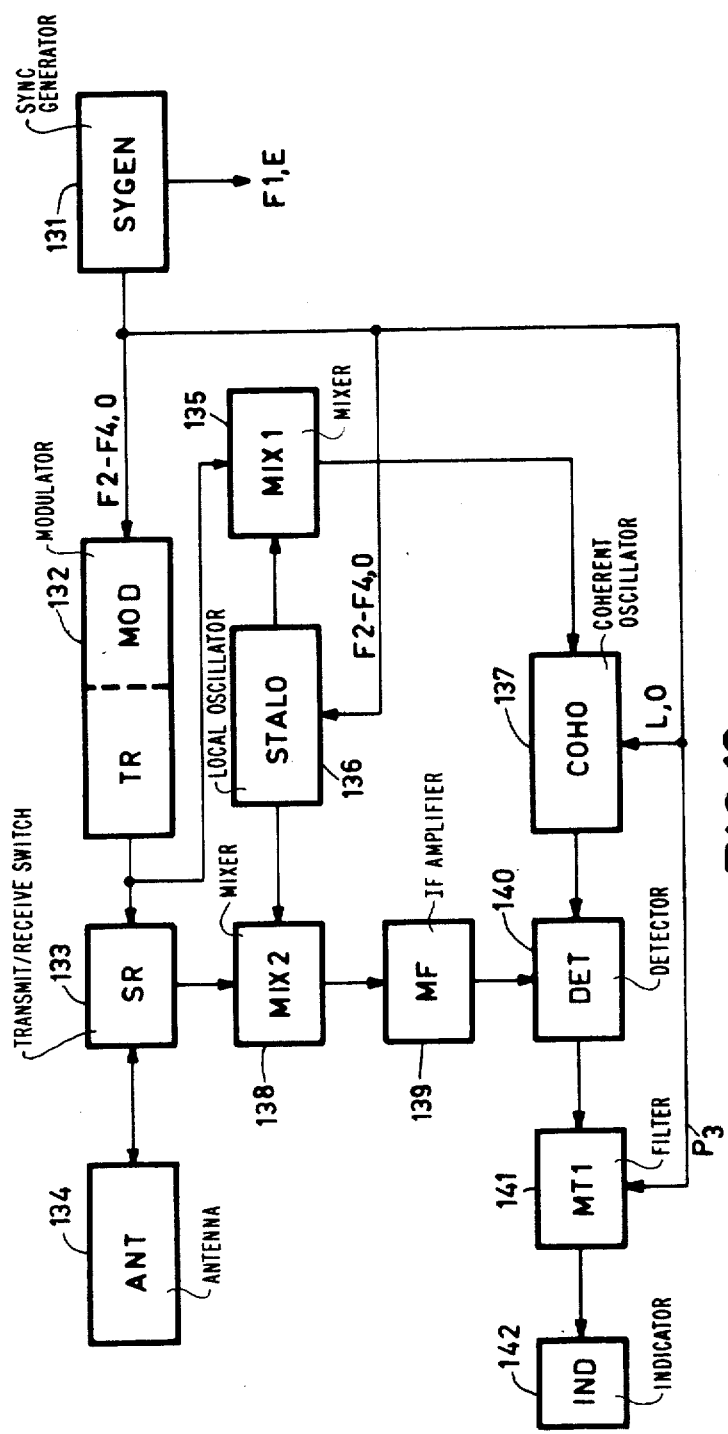
FIG. 13 shows a block diagram of a MTI radar system comprising a pulse generator embodying the invention.

FIG. 13 is a block diagram of a MTI radar system comprising among other things a sync generator which may be a pulse generator embodying the invention.

The sync generator 131 controls a transmitter TR and a modulator MOD 132 comprised therein by means of sync pulses F2-F4 and O. which transmitter in the receiver coherent radar system shown is of a type which starts oscillating again for each transmitted radar pulse and which may for example be a magnetron. The transmitted pulse is passed via a transmitter/receiver switch 133 to the antenna 134. Part of the transmitted pulse is supplied to a first mixer 135, in which it is mixed with the output signal from a stabilized local oscillator 136 which is supplied with the sync pulses F2, F4 and O supplied from sync generator 131. The result thereof is a phase locking pulse which is used for phase locking a coherent oscillator 137, the function of which is to "remember" the frequency of the transmitted pulse until the reception thereof in the form of a radar ech signal.

The sync pulses L and O from sync generator 131 are supplied to coherent oscillator 137, a received radar echo signal is transferred via switch 133 to a second mixer 138, in which it is mixed with the output signal from oscillator 136. This produces an intermediate frequency signal which is supplied to an intermediate frequency amplifier 139. Thereafter detection is performed in detector 140 with the output signal from coherent oscillator 137 used as a reference. Thereafter the detected signal is passed through a MTI filter 141 to an indicator 142. The filter triggering sync pulse F.TR. from the sync generator 131 is supplied to said MTI filter. The sync pulses F1 and E are supplied to external equipment in connection with parts of the radar system which are not shown in the drawing.

What is claimed is

1. An improved generator for generating pulse groups during cycles of operation, each group comprising a predetermined number of pulses of predetermined pulse widths and predetermined spacings within the group, said pulses being suitable for use as synchronization and triggering pulses in a radar system, the pulse generation being carried out purely digitally by using digital circuit elements and dependent on a control frequency which is generated by an oscillator therein the improvement wherein said generator comprises controllable pulse generator means for generating the pulses of each pulse group, a first unit for determining the time space between the pulse groups and comprising a first storage means in which selectable time space numbers are programmed, a first addressing means for generating addresses for said first storage means, and a first sequential counting circuit coupled to said first storage means for receiving a presetting signal from said first storage means and outputting a time space pulse $R_2$ for resetting said first sequential counting circuit to the preset number supplied thereto during each cycle of operation, said sequential counting circuit being clocked by a clock signal T derived from the control frequency; and a second unit for controlling the pulse generator means and comprising second storage means in which pulse edge position numbers for determining said pulse widths and for determining time positions of said pulses are programmed in selectable storage areas, a second addressing means for generating addresses for said second storage means, a second sequential counting circuit coupled to receive said time space pulse $R_2$ from said first sequential counting circuit and clocked by said clock signal T, said second sequential counting circuit being reset to zero by the time space pulse $R_2$ supplied by said first sequential circuit so as to be advanced thereafter, and comparing and addressing means coupled to said second storage means and said second sequential counting circuit for comparing continuously the output signal of said second sequential circuit and the actual pulse edge position number from said second storage means and for generating at a detected correspondence a control signal for that one of said pulse generator means for which the pulse edge position number is intended.

2. A generator as claimed in claim 1, characterized in that said first unit comprises third storage means in which modification numbers for modifying said time space numbers are stored in selectable positions, a logic circuit connected to said third storage means and said first storage means, selected modification numbers and time space numbers being combined in said logical circuit the output of which is connected to a preset input of said first sequential circuit.

3. A generator as claimed in claim 2, characterized in that the first sequential circuit comprises a first counter which is presettable during each operating cycle by means of a time space number which may be modified and further so as to count down thereafter from the preset value to zero, whereupon the time space pulse $R_2$ is generated and the counter is simultaneously preset by the generated time space pulse before the next following cycle of operation, and in that said second sequential circuit comprises a second counter arranged so as to be reset to zero each cycle of operation dependent on the time space pulse and so as to be advanced thereafter until the next following time space pulse will initiate again a reset to zero.

4. A generator as claimed in claims 1 or 2, characterized in that said first unit comprises a step-by-step controlled address counter coupled to an address logic circuit controlled thereby for addressing said first storage means by means of one of a set of addresses stored in a storage area, the address being chosen by a functional mode selection code supplied thereto, said address counter being arranged so as to be advanced once per generated pulse group, in response to a sync signal generated in the pulse group, and so as to generate thereupon an output signal which by said address logic circuit causes a jump to a new address of said set, whereby a step-by-step variation of the pulse group repetition frequency is obtained.

5. A generator as claimed in claim 2, characterized in that said first unit comprises a noisecontrolled counter for generating address information for said modification number storage device, the noise controlled counter being arranged so as to generate continuously new address information dependent on the instantaneous value of a noise signal ($P_1$) supplied thereto, whereby to enable a random selection among said modification numbers and thereby a functional mode of the generator in which the time space of the pulse groups will show a random variation within a range of values defined by the modification numbers and situated around a selected time space.

6. A generator as claimed in claim 2, characterized in that said first unit comprises a calculating device for generating address information for the modification number storage means which calculating device is responsive to information supplied thereto about the actual time space to generate addresses for modification numbers, which when combined with an actual time space number will provide for a time space change, whereby the time space may be modified to accurate values.

7. A generator as claimed in claims 1 or 2, characterized in that said second unit comprises a counter for generating a pulse (L) of the pulse group having a delayed time position which falls within the next following pulse group, which counter during the generation of the pulse group is preset by means of a pulse edge position number supplied by said second storage means, said number corresponding essentially to one half of the elapse of time to the time position of said pulse, said counter being thereafter counted down synchronously with said second sequential circuit from the preset value to zero whereupon a control signal is supplied to the corresponding pulse generator means.

8. A pulse generator as claimed in claims 1 or 2, characterized in that said second unit comprises a shift register for trimming of the time position of a pulse (F.TR.) of the pulse group with respect to other pulses of the group, the shift register having one input and outputs on each shift register element, into which the separate edge position control signals are fed in the shape of a control pulse, which is thereafter advanced through the shift register dependent on a clock pulse signal the frequency of which corresponds to a desired time resolution of the trimming operation, while said control pulse is obtained from the shift register with a delay equal to a desired number of steps by means of a selecting device and dependent on a control signal ($P_3$) supplied thereto and is supplied to the corresponding pulse generator means (F.TR.).

* * * * *